United States Patent
Ozaki et al.

[11] Patent Number: 5,851,286
[45] Date of Patent: Dec. 22, 1998

[54] CRYSTAL PULLING APPARATUS

[75] Inventors: Atsushi Ozaki, Annaka, Japan; Masahiko Urano, Takasaki, Japan; Isamu Harada, Annaka, Japan; Tomohiro Kakegawa, Tomioka, Japan; Hideki Nakano, Sawa, Japan

[73] Assignee: Shin-Etsu Handotai Co., Ltd., Tokyo, Japan

[21] Appl. No.: 763,888

[22] Filed: Dec. 11, 1996

[30]     Foreign Application Priority Data

Dec. 27, 1995  [JP]  Japan .................................. 7-351277

[51] Int. Cl.⁶ .................................................. C30B 35/00
[52] U.S. Cl. ........................... 117/201; 117/202; 117/900
[58] Field of Search .................................. 117/200, 201, 117/202, 900

[56]              References Cited

U.S. PATENT DOCUMENTS 3,165,571  1/1965  Grimes, Jr. ................................ 117/202
5,370,077  12/1994  Hirano et al. ............................ 117/201
5,593,498  1/1997  Kimbel et al. ........................... 117/201

FOREIGN PATENT DOCUMENTS 0 457 201 A2  11/1991  European Pat. Off. .
0 529 571 A1   3/1993  European Pat. Off. .
   02080400    3/1990  Japan .
  403112885A   5/1995  Japan ..................................... 117/201

*Primary Examiner*—Felisa Garrett
*Attorney, Agent, or Firm*—Oliff & Berridge, PLC

[57]                ABSTRACT

A crystal pulling apparatus is disclosed which employs the Czochralski method. The crystal pulling apparatus is operated while a heater for heating a material melt in a crucible is controlled by the main controller of a main system. When maintenance of a heating state is disabled for some reason, a relay of a signal changeover circuit is switched so as to maintain the heating state under control of the backup controller of a backup system, thereby maintaining the material melt in a molten state. Thus, even when it becomes impossible for the main system to heat the material melt within the crucible, the material melt can be prevented from becoming solidified.

4 Claims, 3 Drawing Sheets

CRYSTAL PULLING APPARATUS

BACKGROUND OF THE INVENTION

1. Field of the Invention

The present invention relates to a backup technique for a crystal pulling apparatus employing the Czochralski method (CZ method), to be used in case anomaly occurs therein.

2. Description of the Related Art

In a conventional crystal pulling apparatus employing, for example, the Czochralski method (CZ method), a chamber accommodates a crucible, around which a heater is disposed to melt a polycrystalline material charged into the crucible. A seed crystal is brought into contact with a melt of the polycrystalline material and is subsequently pulled while being rotated, to thereby grow a single crystal.

The heater is supplied with power from, for example, a direct-current power supply unit. The supply of power is controlled in accordance with a setting signal from a main controller while the crystal pulling apparatus is in operation.

The main controller is connected via, for example, input/output interfaces to respective control circuits for drive mechanisms, limit switches, sensors, and the like, so as to totally control the crystal pulling apparatus. Further, in order to secure safety of the apparatus, the supply of power to the heater is interlocked with, for example, sensors provided in an evacuation system within the chamber that includes a vacuum pump, an inert gas feed system, and a cooling water system. For example, when any anomaly occurs in the evacuation system, inert gas feed system, or the like, the power supplied to the heater is shut off to thereby stop heating, for safety.

In the above-described conventional crystal pulling apparatus, when interlock of the main controller is activated for some reason, the power supplied to the heater is shut off, and thus heating is disabled. In this case, a melt of a polycrystalline material remaining in the crucible is solidified as it is.

However, a shutoff of power, which is accompanied by disablement of heating, is not limited to a case where the situation is in urgent need of a shutoff of power to avoid a potential danger. For example, even upon the occurrence of a minor problem, such as a fault in a memory chip (RAM) or a runaway of a program, an entire system halts, resulting in a shutoff of power. Such an unnecessary shutoff of power is no doubt becoming more frequent due to a recent tendency to employ electronic devices in a control system (control by means of a computer and sequencer). Once the power is shut off, regardless of whether it is necessary, a melt of a polycrystalline material becomes completely solidified.

The above-described solidification of a melt of a polycrystalline material causes not only direct damage such as damage to the polycrystalline material, damage to the quartz crucible, and an excess electrical charge but also indirect damage such as the need for work to restore the interior of the chamber (cleaning, inspection for safety, and the like) and lowering of rate of operation. Thus, even a single occurrence of a power shutoff causes enormous damage. Moreover, an abrupt solidification of a large amount of the melt may cause a leak of the melt. If this leads to serious problems such as steam explosion, it would raise a significant social problem. Thus, there has been demand for measures to secure greater safety from such a potential accident.

SUMMARY OF THE INVENTION

The present invention has been accomplished in view of the above-mentioned problems, and it is an object of the invention to provide an environment for maintaining in a molten state a melt of a polycrystalline material remaining in a crucible by maintaining a heating state upon the occurrence of a minor problem in a main controller or the like that would otherwise disable maintenance of the heating state.

The present invention provides a crystal pulling apparatus, wherein a backup system maintains a heating state for a melt of a material when it becomes impossible for a main controller to maintain the heating state during heating.

Thus, in the crystal pulling apparatus of the present invention, the backup system maintains the heating state to thereby maintain the melt of a material in a molten state upon the occurrence of a minor problem in the main controller or the like that would otherwise disable maintenance of the heating state as in a conventional crystal pulling apparatus, which would incur enormous damages from such a minor problem. Accordingly, a user can locate and repair a problem and can take remedial actions, such as replacement of parts, without having to suspend the heating operation. Thus, damages can be minimized, and safety is more greatly secured.

Even though the heating state is briefly interrupted due to a switch from the main system to the backup system, no problem will arise because the thermal capacity of the melt of a material is sufficiently large.

The backup system may be a separate system capable of being connected to the main system or may be integrated with the main system into a single system.

DESCRIPTION OF THE PREFERRED EMBODIMENT

An embodiment of the present invention will now be described with reference to the drawings.

Figure 1:
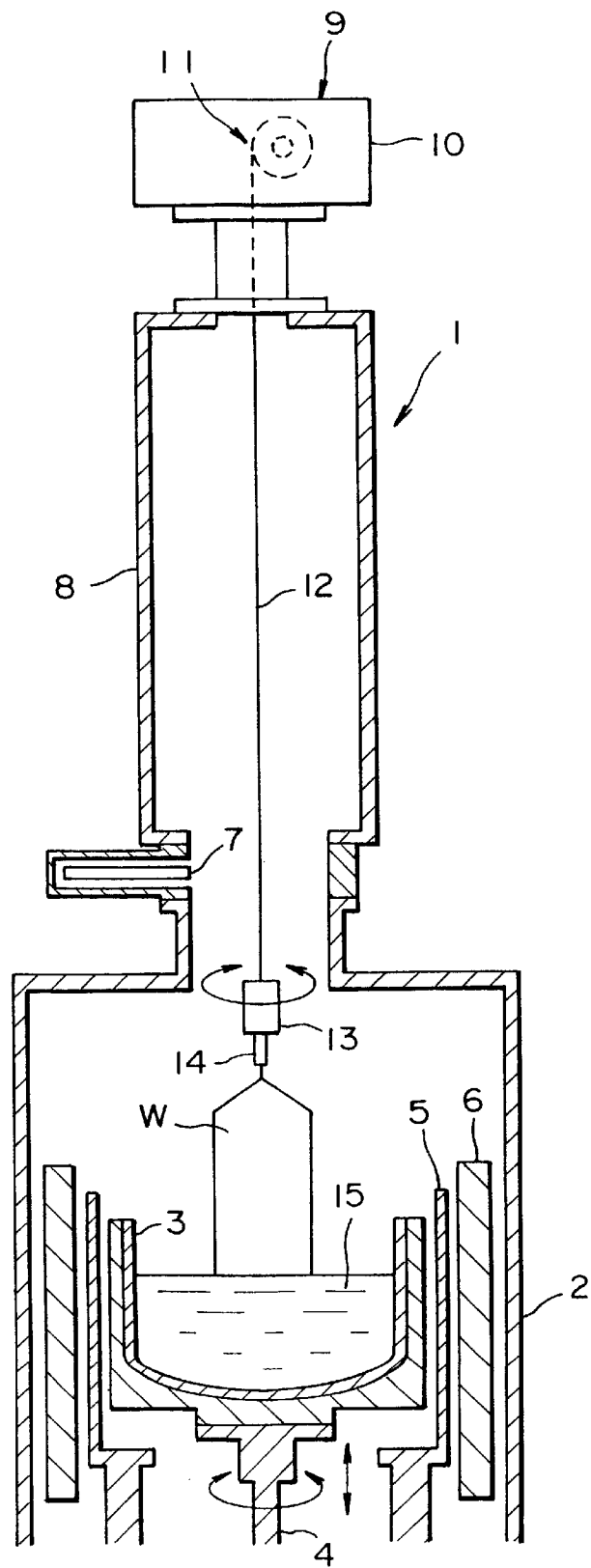
FIG. 1 is a sectional view showing the structure of a crystal pulling apparatus according to the present invention.

As shown in FIG. 1, a crystal pulling apparatus 1 includes a main chamber 2 formed of, for example, a stainless steel cylinder, and a quartz crucible 3 accommodated in the main chamber 2. The quartz crucible 3 is supported movably in a vertical direction and rotatably by a supporting shaft 4 located thereunder. A cylindrical heater 5 made of, for example, graphite is disposed around the crucible 3, and in turn, is surrounded by a heat insulating cylinder 6 made of, for example, graphite. The crucible 3 is rotated as a predetermined speed about the axis of the supporting shaft 4 as well as moved vertically at a predetermined speed by driving means (not illustrated).

A pull chamber 8 is disposed above the main chamber 2 while an isolation valve 7 is disposed therebetween. The isolation valve 7 functions to establish communication between the chambers 2 and 8 and to isolate them from one another. The pull chamber 8 provides a space for accommodating a pulled single crystal and taking out the single crystal from the crystal pulling apparatus 1, and is made of, for example, stainless steel. A winding mechanism 9 is mounted above the pull chamber 8.

The winding mechanism 9 is adapted to pull a crystal, and includes a housing box 10 and a winding drum 11 accommodated within the box 10. The box 10 is rotatable about a vertical axis with respect to the pull chamber 8. A wire 12 is wound onto the winding drum 11. The wire 12 extends downward, and a seed crystal holding jig 13 for holding a seed crystal 14 is attached to the lower end of the wire 12.

When a single crystal is to be produced in the crystal pulling apparatus 1 having the above-described structure, the isolation valve 7 is opened so as to establish communication between the main chamber 2 and the pull chamber 8, and then the chambers 2 and 8 are both evacuated to be filled with an inert gas. Subsequently, a polycrystalline material such as silicon is charged into the crucible 3, which is then heated by the heater 5 to thereby melt the polycrystalline material, obtaining a material melt 15.

Next, the winding drum 11 is rotated to gradually release the wire 12 downward until the seed crystal 14 attached to the bottom end of the wire 12 dips into the material melt 15.

Then, the supporting shaft 4 is rotated to thereby rotate the crucible 3 supported by the supporting shaft. 4, and at the same time, the winding drum 11 is rotated so as to wind up the wire 12. As a result, a single crystal W is pulled which grows around the seed crystal 14.

While the single crystal W is being pulled, the heater 5, which is connected to a direct-current power unit 19, described below, is being controlled by a setting signal from a main controller 16.

Figure 2:
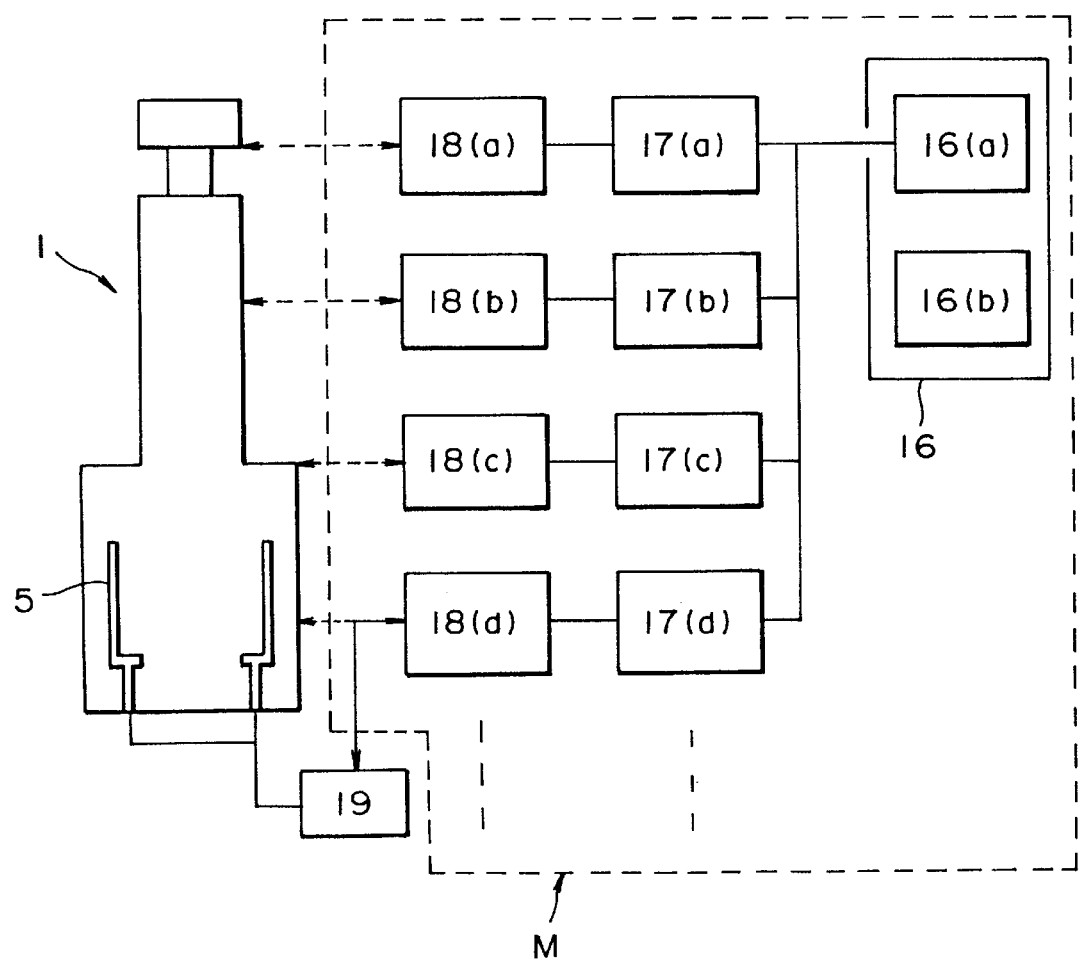
FIG. 2 is a schematic block diagram showing the control mechanism of a main system of the crystal pulling apparatus according to the present invention.

Next, the control mechanism of a main system of the crystal pulling apparatus 1 will be described briefly with reference to FIG. 2.

The control mechanism of a main system M outputs control signals to respective drive sections and the like in accordance with signals received from unillustrated sensors, limit switches, and the like in the crystal pulling apparatus 1. In the control mechanism, the main controller 16 that includes a CPU 16a and a memory 16b is connected via input/output interfaces 17a, etc., to control circuits 18a, etc., which, in turn, are connected to sensors, drive sections, and the like in the crystal pulling apparatus 1.

A mechanism for controlling the heater 5 is constructed such that the main controller 16 is connected via the input/output interface 17d to a direct-current power control circuit 18d, which, in turn, is connected to the heater 5 via a direct-current power supply unit 19, to thereby control the supply of power to the heater 5. In this case, in order to secure safety of the crystal pulling apparatus 1, the supply of power to the heater 5 is interlocked with sensors provided in an evacuation system that includes a vacuum pump, a inert gas feed system, and an electrode cooling water system. Thus, the power supplied to the heater 5 is shut off upon the occurrence of not only a fault in the input/output interface 17d directly connected to the direct-current power supply unit 19 but also a fault in an input/output interface 17n, etc., which is used for interlock, a fault in a sensor, a fault in the main controller 16 itself, a runaway of a program, or a like fault. As a result, maintenance of the heating state is disabled.

In order to cope with this problem, the below-described backup system of the present invention makes the best use of a feature of a crystal pulling apparatus which employs the CZ method. The feature is that even when the pulling of a single crystal is temporarily disabled during the process of pulling the single crystal, the pulling operation can be retried so long as the material melt 15 within the crucible 3 is maintained in a molten state.

In the above-described main system M, an independent main controller 16 is used to control a crystal pulling apparatus 1. However, the main controller 16 may be connected to a host computer for centralized control of two or more crystal pulling apparatuses. Alternatively, several computers may be used for distributed processing of a crystal pulling apparatus.

Figure 3:
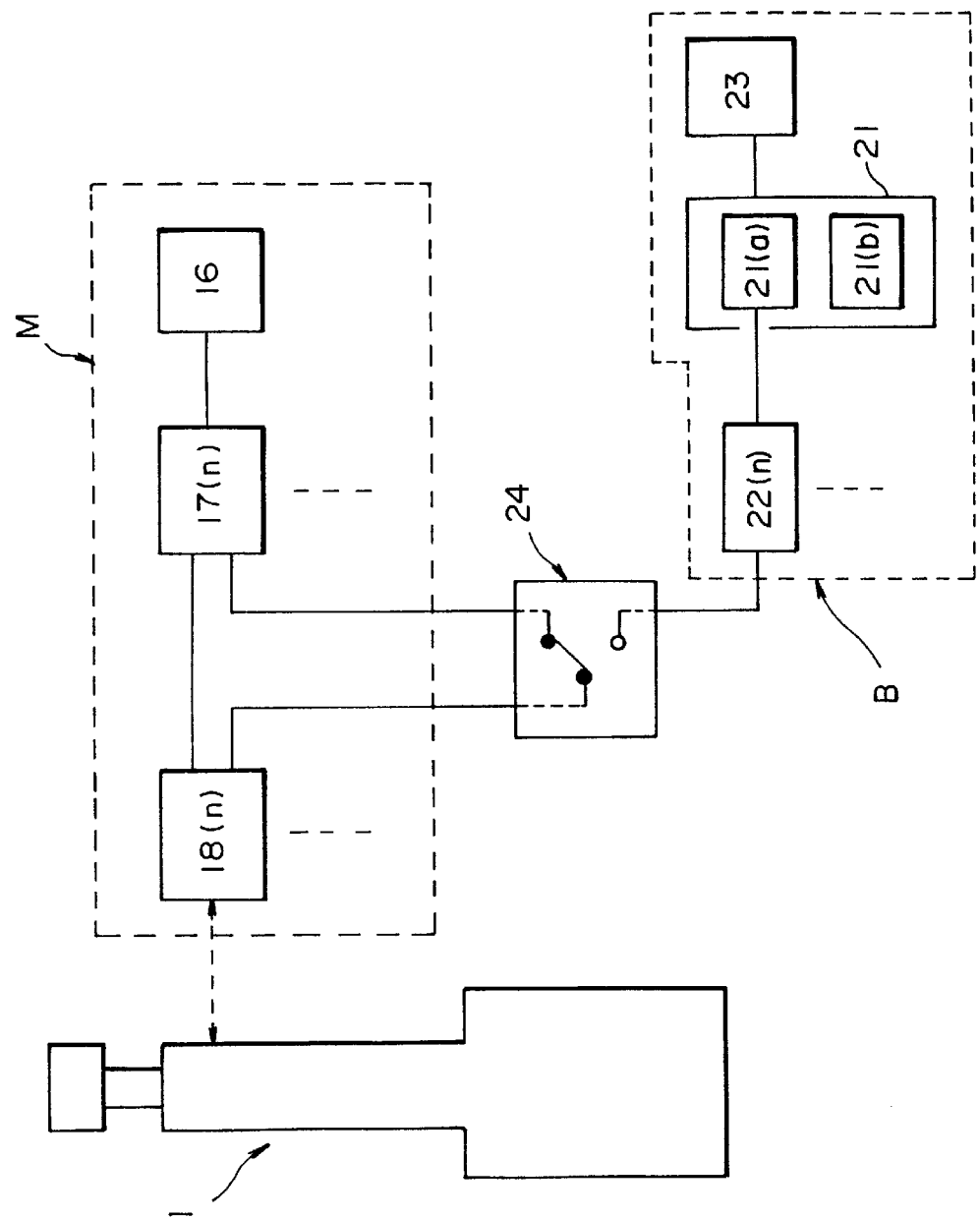
FIG. 3 is a schematic block diagram showing the control mechanism of a backup system according to the present invention.

FIG. 3 shows the control mechanism of a backup system, which is a core of the present invention.

A backup system B includes a backup controller 21 that includes a CPU 21a and a memory 21b, input/output interfaces 22n, etc., connected to the backup controller 21, and an operation panel 23 for operating the backup system B therefrom. This backup system B outputs signals via a signal changeover circuit 24 so as to back up control signals from the main system M.

When the backup system B is activated, a user, for example, can turn on/off heating and can control the power supplied to the heater 5 from the operation panel 23.

The signal changeover circuit 24 includes, for example, a relay which is installed in the midst of control signal lines such that a signal line from the main controller 16 is connected to a normally closed B contact while a signal line from the backup controller 21 is connected to a normally opened A contact. Each control unit (load) is connected to a common contact.

Accordingly, in the normal state (when the relay is off), a signal from the main controller 16 is transmitted to each control unit (load) while in the backup state (when the relay is on), a signal from the backup controller 21 is transmitted to each control unit (load).

Signals to be backed up may be minimized to those for maintaining the material melt 15 within the crucible 3 in a molten state. Examples of such signals include a preparation-for-heating on/off signal, a heating on/off signal, and a power setting signal, which are used for heating control.

Examples of backup signals required for interlock include a vacuum pump on/off signal and an evacuation on/off signal used in evacuation system control; an argon main valve on/off signal and an argon flow setting signal used in inert gas (argon) control; and a cooling water off detection signal and an apparatus temperature up detection signal used in cooling water control for electrodes or the like.

Signals to be backed up are not limited to the above-described signals, but may be selected as needed.

As described above, the backup system B is activated when maintenance of the heating state is disabled while the crystal pulling apparatus 1 is in operation. That is, upon the occurrence of such an anomaly, a signal is issued that switches the signal changeover circuit 24 so as to enable control by the backup controller 21 (in the present embodiment, a signal that turns on the changeover relay is issued). Subsequently, a user turns on/off heating, sets the power supplied to the heater 5, and performs other necessary operations from the operation panel 23, to thereby restore and maintain the heating state. While the crystal pulling apparatus 1 is under control of the backup system B, the user locates and takes remedial actions such as repairs. The signal changeover circuit 24 is switched manually upon the occurrence of anomaly, but may be switched automatically upon the occurrence of anomaly.

In this case, even though the heating state is briefly, for example several minutes, interrupted, the material melt 15 will not become solidified because the thermal capacity of the material melt 15 is sufficiently large.

In the above-described embodiment, the separate backup system B is connected to the existing main system M of the crystal pulling apparatus 1. However, the main system M and the backup system B may be integrally arranged within the crystal pulling apparatus 1.

What is claimed is:

1. A crystal pulling apparatus in which a seed crystal is contacted to a melt of a material and is then pulled so as to grow a single crystal, said crystal pulling apparatus comprising:

a main controller for performing heating control so as to heat the melt, the main controller being included in a main system; and a backup system for maintaining a heating state of the melt when it becomes impossible for said main controller to maintain the heating state.

2. A crystal pulling apparatus according to claim 1, wherein said backup system is a separate system connectable to said main system.

3. A crystal pulling apparatus according to claim 1, wherein said backup system is integrated with said main system into a single system.

4. A crystal pulling apparatus according to claim 1, wherein said backup system backs up signals for controlling heating of the melt, including at least a preparation-for-heating on/off signal, a heating on/off signal, and a power setting signal.

* * * * *